United States Patent
Yuasa et al.

(10) Patent No.: US 7,515,387 B2
(45) Date of Patent: Apr. 7, 2009

(54) MAGNETORESISTIVE EFFECT ELEMENT, AND MAGNETIC HEAD AND MAGNETIC REPRODUCING APPARATUS INCLUDING THE SAME

(75) Inventors: Hiromi Yuasa, Kawasaki (JP); Hideaki Fukuzawa, Kawasaki (JP); Hitoshi Iwasaki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 446 days.

(21) Appl. No.: 11/248,296

(22) Filed: Oct. 13, 2005

(65) Prior Publication Data
US 2006/0077596 A1 Apr. 13, 2006

(30) Foreign Application Priority Data
Oct. 13, 2004 (JP) ............... P2004-298773

(51) Int. Cl.
*G11B 5/127* (2006.01)
(52) U.S. Cl. .................................. 360/324.1
(58) Field of Classification Search ............... None
See application file for complete search history.

(56) References Cited

U.S. PATENT DOCUMENTS

| | | | | |
|---|---|---|---|---|
| 6,181,537 | B1 * | 1/2001 | Gill | 360/324.2 |
| 6,646,834 | B2 * | 11/2003 | Sano et al. | 360/324.11 |
| 6,707,649 | B2 * | 3/2004 | Hasegawa et al. | 360/324.12 |
| 6,710,986 | B1 * | 3/2004 | Sato et al. | 428/811.1 |
| 7,123,453 | B2 * | 10/2006 | Hasegawa et al. | 360/324.11 |
| 7,220,498 | B2 * | 5/2007 | Nagahama et al. | 428/811.1 |
| 7,227,728 | B2 * | 6/2007 | Lin | 360/324.1 |
| 2002/0048128 | A1 * | 4/2002 | Kamiguchi et al. | 360/324.1 |
| 2002/0051380 | A1 | 5/2002 | Kamiguchi et al. | |
| 2004/0021990 | A1 | 2/2004 | Koui et al. | |
| 2004/0042127 | A1 * | 3/2004 | Hoshiya et al. | 360/322 |

(Continued)

FOREIGN PATENT DOCUMENTS

EP 1626393 2/2006

(Continued)

OTHER PUBLICATIONS

Nagasaka et al., "Giant Magnetoresistance Properties of Specular Spin Valve Films in a Current Perpendicular to Plane Structure", Journal of Applied Physics, vol. 89, No. 11, Jun. 1, 2001, pp. 6943-6945.

(Continued)

*Primary Examiner*—Mark Blouin
(74) *Attorney, Agent, or Firm*—Nixon & Vanderhye, PC

(57) ABSTRACT

A spin-valve magnetoresistive effect film includes a magnetization fixed layer, a magnetization free layer, and a nonmagnetic intermediate layer interposed therebetween. The nonmagnetic intermediate layer has a conduction part disposed in an insulation layer and made of a nonmagnetic metal material. The ferromagnetic film stacked on an upper side of the nonmagnetic intermediate layer, out of ferromagnetic films constituting the magnetization fixed layer and the magnetization free layer has a perpendicular orientation part which is disposed above the conduction part and whose crystal growth direction is substantially perpendicular to a film plane, and a non-perpendicular orientation part which exists in a portion other than the perpendicular orientation part. A magnetoresistive effect element has a pair of electrodes passing a sense current in a direction perpendicular to the film plane of the spin-valve magnetoresistive effect film.

19 Claims, 9 Drawing Sheets

U.S. PATENT DOCUMENTS

| | | |
|---|---|---|
| 2004/0201929 A1 | 10/2004 | Hashimoto et al. |
| 2004/0246631 A1* | 12/2004 | Dieny et al. ............... 360/324.1 |
| 2005/0111145 A1 | 5/2005 | Yuasa et al. |
| 2005/0168887 A1 | 8/2005 | Yuasa et al. |
| 2005/0201020 A1 | 9/2005 | Fuke et al. |
| 2006/0034022 A1 | 2/2006 | Fukuzawa et al. ......... 360/324.1 |
| 2006/0050444 A1 | 3/2006 | Fukuzawa et al. ........... 360/324 |
| 2006/0056114 A1* | 3/2006 | Fukumoto et al. ......... 360/324.2 |
| 2006/0077595 A1 | 4/2006 | Yuasa et al. .............. 360/324.1 |
| 2006/0098353 A1 | 5/2006 | Fukuzawa et al. ........ 360/324.1 |
| 2006/0209472 A1 | 9/2006 | Koui et al. ................ 360/324.1 |
| 2007/0091511 A1* | 4/2007 | Hoshiya et al. ........... 360/324.1 |

FOREIGN PATENT DOCUMENTS

| | | |
|---|---|---|
| JP | 2004-119534 | 4/2004 |
| JP | 2004-233641 | 8/2004 |
| JP | 2004-257123 | 9/2004 |
| JP | 2004-298774 | 10/2004 |
| JP | 2004-325315 | 11/2004 |
| JP | 2005-075140 | 3/2005 |
| KR | 10-2006-0050327 | 5/2006 |

OTHER PUBLICATIONS

Takagishi et al., "The Applicability of CPP-GMR Heads for Magnetic Recording", IEEE Transactions on Magnetics, vol. 38, No. 5, Sep. 2002, pp. 2277-2282.

Fukuzawa et al., *MR Ratio Enhancement by Nol Current-Confined-Path Structures in CPP Spin Valves,* IEEE Transactions on Magnetics, vol. 40, No. 4, Jul. 2004, pp. 2236-2238.

Fukuzawa et al, *Nanoconstricted structure for current-confined path in current-perpendicular-to-plane spin valves with high magnetoresistance,* Journal of Applied Physics 97, 10C509 (2005), 3 pages.

* cited by examiner

MAGNETORESISTIVE EFFECT ELEMENT, AND MAGNETIC HEAD AND MAGNETIC REPRODUCING APPARATUS INCLUDING THE SAME

CROSS-REFERENCE TO RELATED APPLICATIONS

This application is based upon and claims the benefit of priority from the prior Japanese Patent Application No. 2004-298773, filed on Oct. 13, 2004; the entire contents of which are incorporated herein by reference.

BACKGROUND

1. Field of the Invention

The present invention relates to a magnetoresistive effect element, and a magnetic head and a magnetic reproducing apparatus including the same.

2. Description of the Related Art

In recent years, the development of a magnetoresistive effect element has been progressing. In particular, in accordance with the development of a magnetoresistive effect film exhibiting a giant magnetoresistive effect (GMR), a magnetic device including the same, especially a magnetoresistive effect head (MR head) used as a magnetic head has made a remarkable improvement in its performance.

A spin-valve film is a known example of the GMR film. The spin-valve film has a nonmagnetic layer (called an intermediate layer, a spacer layer, or the like) interposed between two ferromagnetic layers. In such a structure, an exchange bias magnetic field is applied to one of the ferromagnetic layers (called a magnetization fixed layer, a pinned layer, or the like) so as to fix its magnetization, and the magnetization of the other ferromagnetic layer (called a magnetization free layer, a free layer, or the like) is inverted by an external magnetic field such as a signal magnetic field. Then, a relative angle of magnetization directions of the magnetization fixed layer and the magnetization free layer is changed, so that a high magnetoresistive effect can be obtained.

As a GMR element, there has been proposed an element having a so-called CPP (Current Perpendicular to Plane) structure in which a sense current is passed in a direction perpendicular to a film plane of a magnetoresistive effect film. In a spin-valve GMR element, an improvement in a MR change ratio by applying the CPP structure is also expected, and it has been reported that the CPP-GMR element has achieved a MR change ratio about ten times as large as that of a CIP (Current in Plane) GMR element. Further, the CPP-GMR element also has an advantage of having a lower resistance compared with that of a TMR element utilizing a tunnel effect.

In the spin-valve GMR element, the total thickness of spin-dependent layers is very small and the number of interfaces is also small. Therefore, when the CPP structure is applied thereto, the resistance of the element becomes small, resulting in a small output absolute value. For example, when a current is perpendicularly passed to a spin-valve GMR element in which the thickness of each of a magnetization fixed layer and a magnetization free layer is 5 nm, an output absolute value is as small as about 0.5 mΩ per 1 μm². That is, in order to put the spin valve GMR element with the CPP structure into practical use, it is important to heighten a resistance value of a portion involved in spin-dependent conductance in the element to increase a resistance change amount, thereby making its output larger.

Regarding this point, a known method for improving a magnetoresistive effect is a method in which a resistance adjusting layer including an insulator is inserted as an intermediate layer in a spin-valve film (see J. Appl. Phys. 89, 6943 (2001), IEEE Trans. Mag. 38, 2777 (2000)). A spin-valve GMR element has portions where electrons make spin-dependent scattering (a magnetization fixed layer/an intermediate layer/a magnetization free layer) and portions with small spin-dependent scattering (a base layer, an antiferromagnetic layer, a protective layer, and so on). A magnetoresistive effect of the spin-valve GMR element (MR) can be expressed as MR=Rsd/(Rsd+Rsi) where Rsd is a resistance of the former and Rsi is a resistance of the latter. Therefore, MR is more enhanced as Rsd is larger than Rsi to a greater extent. The spin-valve GMR element with the CPP structure having the resistance adjusting layer including the insulator utilizes this effect.

In the spin-valve GMR element with the CPP structure, the resistance adjusting layer is composed of a complete insulator part where no current flows and a conduction part (metal path) allowing the current flow. In the vicinity of the resistance adjusting layer, the current is constricted toward the conduction part. In the spin-valve GMR element with the CPP structure as described above, owing to the current constriction effect, portions right above and right under the conduction part serve as current paths both in the magnetization fixed layer and the magnetization free layer. Therefore, controlling the state of the current paths including the conduction part is important in order to improve the magnetoresistive effect (MR). However, the conventional spin-valve GMR element only increases the resistance of the spin-dependent scattering part by the resistance adjusting layer (intermediate layer), and no control over the state of the current path is performed. Therefore, a large magnetoresistance effect (MR) owing to the adoption of the conduction part has not been achieved yet with good reproducibility.

SUMMARY

It is an object of the present invention to provide a magnetoresistive effect element in which a giant magnetoresistive effect based on a conduction part disposed in an insulation layer is achieved with good reproducibility by controlling the state of a current path including the conduction part when an intermediate layer having the conduction part is adopted in a spin-valve GMR element with a CPP structure, and to provide a magnetic head and a magnetic reproducing apparatus including the magnetoresistive effect element.

A magnetoresistive effect element according to one of the aspects of the present invention includes a magnetization fixed layer having a ferromagnetic film whose magnetization direction is fixed substantially in one direction, a magnetization free layer having a ferromagnetic film whose magnetization direction changes according to an external magnetic field, a nonmagnetic intermediate layer having an insulation layer and a conduction part, the insulation layer being interposed between the magnetization fixed layer and the magnetization free layer, and the conduction part being disposed in the insulation layer so as to connect the magnetization fixed layer and the magnetization free layer and made of a nonmagnetic metal material, and a pair of electrodes arranged so as to pass a sense current in a direction substantially perpendicular to film planes of the magnetization fixed layer, the nonmagnetic intermediate layer, and the magnetization free layer, wherein the ferromagnetic film stacked on an upper side of the nonmagnetic intermediate layer, out of the ferromagnetic films constituting the magnetization fixed layer and the magnetization free layer, has a perpendicular orientation part and a non-perpendicular orientation part, the perpendicular orientation part being disposed above the conduction part, with crystal growth direction thereof substantially perpendicular to the film plane, and the non-perpendicular orientation part existing in a portion other than the perpendicular orientation part.

A magnetic head according to another aspect of the present invention comprises the magnetoresistive effect element according to the above aspect of the present invention. A magnetic reproducing apparatus according to still another aspect of the present invention comprises a magnetic recording medium, and a magnetic head which reads information magnetically recorded on the magnetic recording medium and includes the magnetoresistive effect element according to the above aspect of the present invention.

DETAILED DESCRIPTION

Hereinafter, embodiments of the present invention will be described with reference to the drawings. It should be noted that, though the embodiments of the present invention will be described below based on the drawings, these drawings are presented only for an illustrative purpose and in no way limit the present invention.

Figure 1:
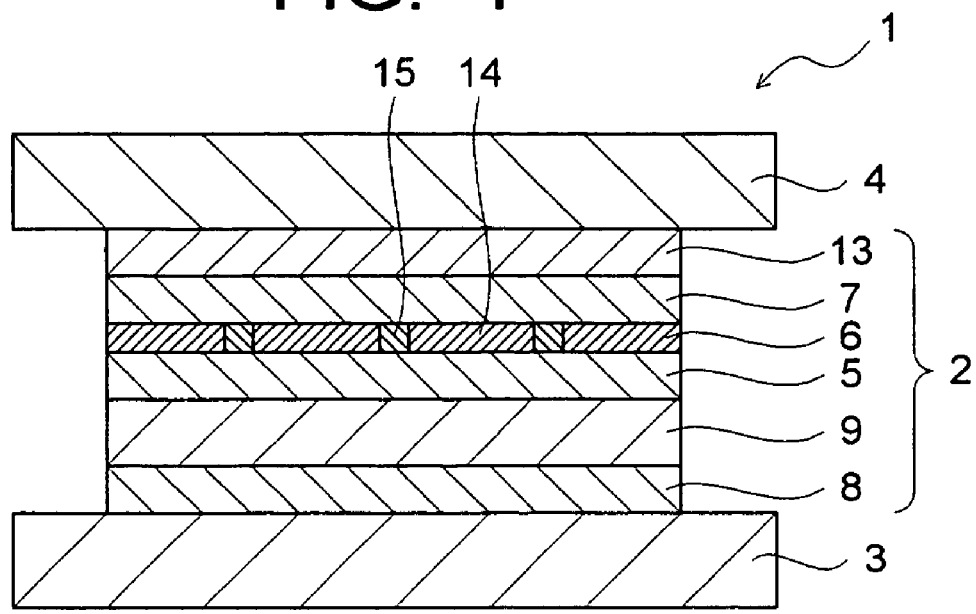
FIG. 1 is a cross-sectional view schematically showing a structure of a magnetoresistive effect element according to an embodiment of the present invention.

FIG. 1 is a cross-sectional view showing a structure of a magnetoresistive effect element according to one embodiment of the present invention. A magnetoresistive effect element 1 shown in FIG. 1 is mainly constituted of a magnetoresistive effect film 2 having a spin-valve structure and a pair of electrodes 3, 4 disposed so as to pass a sense current in a direction substantially perpendicular to a film plane of the spin-valve magnetoresistive effect film 2. The spin-valve magnetoresistive effect film 2 enhances practicability of the magnetoresistive effect element 1.

The spin-valve magnetoresistive effect film 2 has a multi-layer film structure of a magnetization fixed layer 5/a nonmagnetic intermediate layer 6/a magnetization free layer 7. An antiferromagnetic layer 9 made of a Pt—Mn alloy, an Ir—Mn alloy, or the like is formed on the lower electrode 3 via an under layer 8. A ferromagnetic film constituting the magnetization fixed layer 5 is formed on the antiferromagnetic layer 9. A magnetization direction of this ferromagnetic film is fixed substantially in one direction by an exchange bias magnetic field from the antiferromagnetic layer 9, so that the ferromagnetic film functions as the magnetization fixed layer 5.

Figure 2:
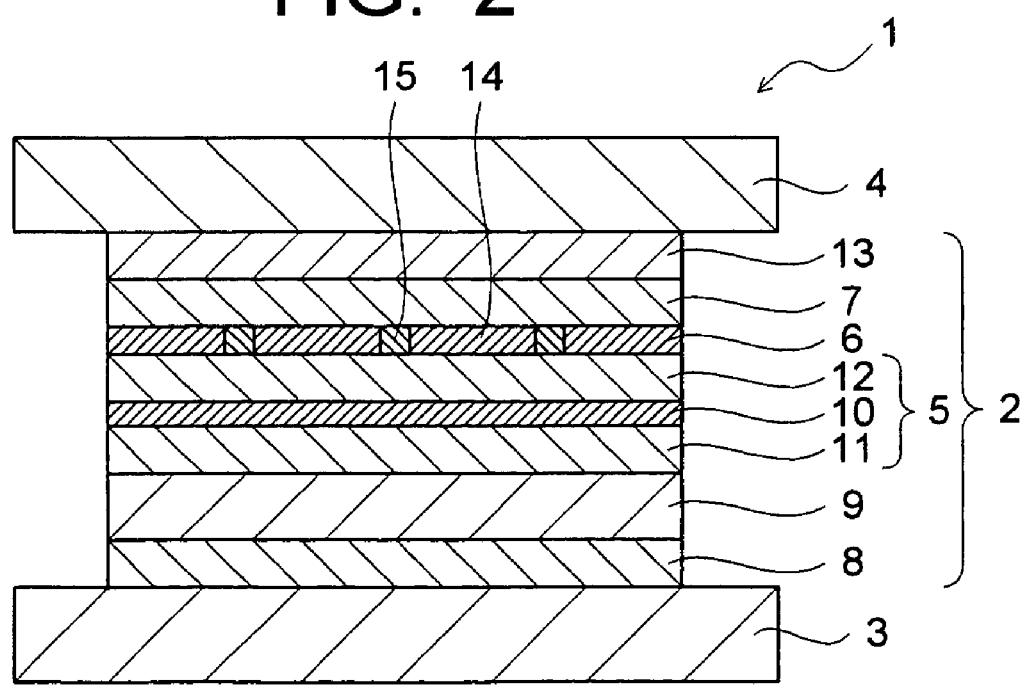
FIG. 2 is a cross-sectional view showing a modification example of the magnetoresistive effect element shown in FIG. 1.

The magnetization fixed layer 5 is not limited to that with a single layer structure shown in FIG. 1 but may have a multilayer structure. FIG. 2 shows a magnetization fixed layer 5 made of a multilayer film in which ferromagnetic films 11, 12 are disposed on both sides of a magnetization antiparallel coupling layer 10 made of Ru or the like. In this structure, a magnetization direction of the ferromagnetic film 11 is fixed in one direction by the antiferromagnetic layer 9. Further, the ferromagnetic films 11, 12 are coupled to each other via the magnetization antiparallel coupling layer 10 with the magnetizations thereof being antiparallel. Examples of a material used for the ferromagnetic film constituting the magnetization fixed layer 5 are Fe, Co, Ni, an alloy of these elements, an alloy mainly composed of these elements, and the like.

A ferromagnetic film functioning as the magnetization free layer 7 is formed on the magnetization fixed layer 5 via the nonmagnetic intermediate layer 6. A magnetization direction of this ferromagnetic film changes according to an external magnetic field such as a signal magnetic field, so that it functions as the magnetization free layer 7. Examples of a material used for the ferromagnetic film constituting the magnetization free layer 7 are Fe, Co, Ni, an alloy of these elements, an alloy mainly composed of these elements, and so on, similarly to the magnetization fixed layer 5. Further, the structure of the magnetization free layer 7 is not limited to a single layer structure, either, and a multilayer structure including the ferromagnetic film is applicable. A protective layer 13 is formed on the magnetization free layer 7, and the upper electrode 4 is disposed thereon.

The film thickness of each of the magnetization fixed layer 5 and the magnetization free layer 7, though not limited to a specific value, is preferably, for example, 10 nm or less. Note that the positions of the magnetization fixed layer 5 and the magnetization free layer 7 maybe reversed though FIG. 1 and FIG. 2 show the spin-valve magnetoresistive effect films 2 in each of which the magnetization fixed layer 5 is disposed on a lower layer side. That is, it is also possible to adopt a film structure in which the magnetization free layer 7 is disposed on the lower layer side, and the magnetization fixed layer 5 is disposed thereabove via the nonmagnetic intermediate layer 6. Further, the spin-valve magnetoresistive effect film 2 may have a dual spin-valve structure having two nonmagnetic intermediate layers.

The nonmagnetic intermediate layer 6 interposed between the magnetization fixed layer 5 and the magnetization free layer 7 includes an insulation part 14 and a conduction part 15. The insulation part 14 forms an entire shape of the nonmagnetic intermediate layer 6 and is disposed between the magnetization fixed layer 5 and the magnetization free layer 7 in layers. For the insulation part (insulation layer) 14, used is a nonmagnetic metal oxide, metal carbide, metal nitride, or the like whose electric conduction characteristic is insulative. Concrete examples of such chemical compounds are an oxide, a carbide, and a nitride of Al, Ta, Cr, Hf, Mg, Cu, Ca, Ba, Sr, Zr, Li, Ti, Nb, Mo, Si, Y, a rare earth element, and the like.

In the insulation part (insulation layer) 14 disposed in layers, one conduction part 15 or more is(are) disposed so as to connect the magnetization fixed layer 5 and the magnetization free layer 7. The conduction part 15 realizes point contact between the magnetization fixed layer 5 and the magnetization free layer 7. Such point contact based on the conduction part 15 can increase a resistance value Rsd of a portion where spin-dependent scattering of electrons are caused (the magnetization fixed layer 5/the nonmagnetic intermediate layer 6/the magnetization free layer 7).

The conduction part 15 described above is made of a nonmagnetic metal material. Examples used as the nonmagnetic metal material constituting the conduction part 15 are at least one kind selected from Cu, Au, Ag, Pt, Cr, Ta, Ti, and Mn, an alloy mainly composed of these, and the like. The size of the conduction part 15 (a two-dimensional size of the smallest portion) is preferably, for example, in a range from 2 nm to 5 nm. Too large a size of the conduction part 15 cannot provide a sufficient effect of improving the resistance value by the current constriction or the like. Too small a size of the conduction part 15, on the other hand, involves a possibility of lowering reproducibility of the point contact by the conduction part 15.

The film thickness of the nonmagnetic intermediate layer 6 constituted of the insulation part 14 and the conduction part 15 is preferably, for example, 5 nm or less in view of enhancing the formability of the microscopic conduction part 15 and the formability of the point contact by the conduction part 15. The film thickness of the nonmagnetic intermediate layer 6 is more preferably 3 nm or less. Considering the formability of a uniform film of an insulating material (insulation part 14), the film thickness of the nonmagnetic intermediate layer 6 is preferably 1 nm or more. It is only necessary for the nonmagnetic intermediate layer 6 that the conduction part 15 thereof is in contact with the magnetization fixed layer 5 and the magnetization free layer 7, and the conduction part 15 may have a portion extended to an upper and a lower side or to the lower side of the insulation part 14 (a portion arranged in layers or the like).

Figure 3:
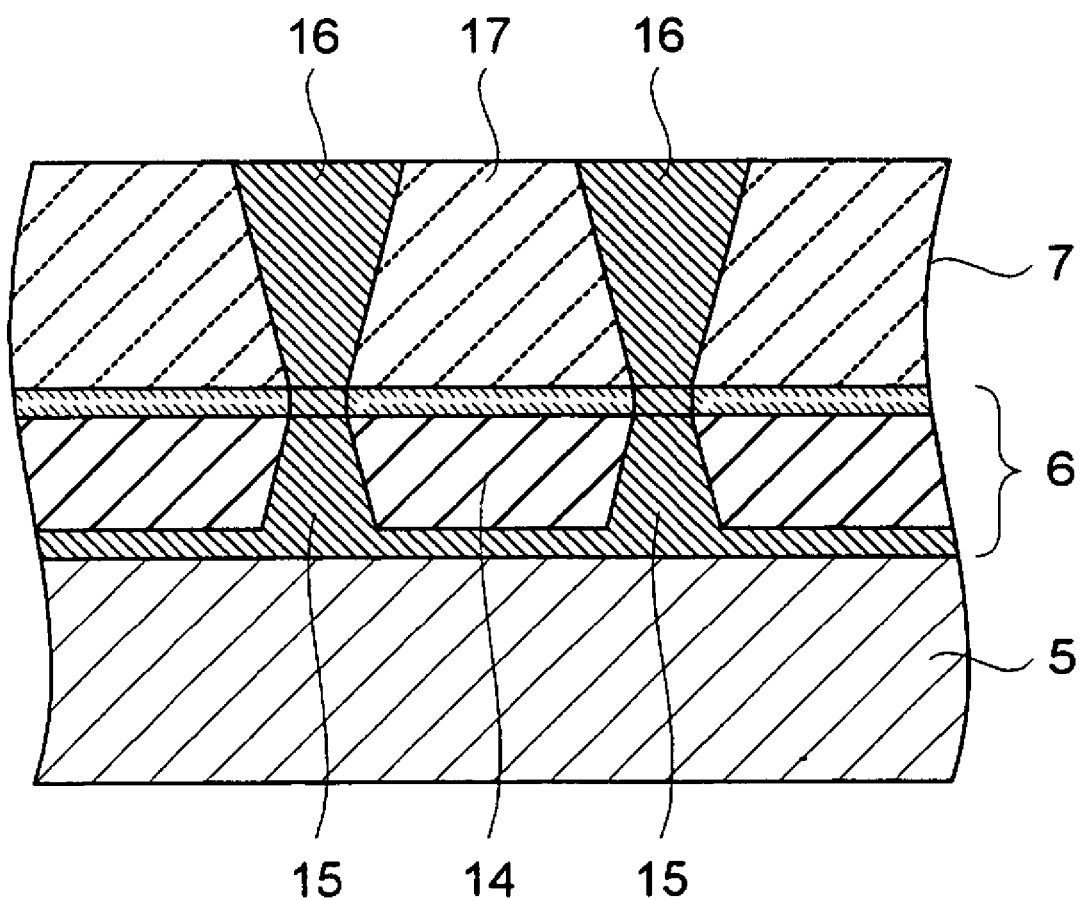
FIG. 3 is an enlarged cross-sectional view of a portion of the magnetoresistive effect element shown in FIG. 1.

The conduction part 15 made of the nonmagnetic metal material is excellent in crystallinity, in other words, it has a state of crystal orientation. A ferromagnetic film functioning as the magnetization free layer 7 is stacked on the nonmagnetic intermediate layer 6 including the conduction part 15 whose crystallinity is improved. Crystal growth of the magnetization free layer 7 is continuous above the conduction part 15, so that crystallinity of this portion can be improved. Concretely, the direction of crystal growth can be aligned substantially perpendicular to the film plane. Specifically, as shown in FIG. 3, the ferromagnetic film constituting the magnetization free layer 7 has, in portions positioned above the conduction parts 15, perpendicular orientation parts 16 whose crystal growth direction is substantially perpendicular to the film plane. The direction substantially perpendicular to the film plane covers directions within a ±5° range from the direction perpendicular to the film plane, and any direction within this range is allowed as the crystal growth direction of the perpendicular orientation parts 16.

The insulation parts (insulation layer) 14 in the nonmagnetic intermediate layer 6 become amorphous. Therefore, portions positioned above the insulation parts 14 in the magnetization free layer 7 become in an amorphous state or a low-crystalline state (in an inferior-quality crystalline state) due to the state of the insulation parts 14. This is true to a case where the extended conduction parts exist between the insulation parts 14 and the magnetization free layer 7. Thus, the portions other than the perpendicular orientation parts 16 in the ferromagnetic film constituting the magnetization free layer 7 are non-perpendicular orientation parts 17 having the amorphous state or the low-crystalline state. Note that the state of the non-perpendicular orientation parts 17 is not limited to the amorphous state or the low-crystalline state, but may be a crystalline state whose orientation direction is different from that of the perpendicular orientation parts 16. Note that the conduction parts 15 shown in FIG. 3 have the portions extended to the upper and lower sides of the insulation parts 14 (layered portions).

As described above, the ferromagnetic film constituting the magnetization free layer 7 has the perpendicular orientation parts 16 existing above the conduction parts 15, and the non-perpendicular orientation parts 17 which exist in the other portions and which are in the amorphous state, the low-crystalline state, the crystalline state having a different orientation direction from that of the perpendicular orientation parts 15, or the like. Here, the crystallinity quality and crystal growth direction of the conduction parts 15 and the magnetization free layer 7 can be assessed based on whether or not an atomic image is projected when these parts are observed with across-section TEM. Specifically, an atomic image of a portion with high crystallinity is clearly projected in the cross-section TEM image, and its crystal growth direction can be determined by further Fourier-transforming this cross-section TEM image. On the other hand, an atomic image of an amorphous portion or a low-crystalline portion is not clearly projected in the cross-section TEM image. Its state can be determined by further Fourier-transforming such a cross-section TEM image.

Figure 4A:
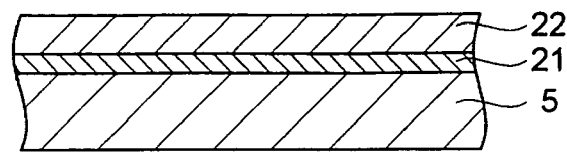
FIG. 4A, FIG. 4B, FIG. 4C, and FIG. 4D are cross-sectional views showing an example of manufacturing processes of a portion of a spin-valve magnetoresistive effect film in the magnetoresistive effect element shown in FIG. 1.

The conduction parts 15 and the magnetization free layer 7 having the above-described state can be formed, for example, in the following manner. Manufacturing processes of the conduction parts 15 and the magnetization free layer 7 will be described with reference to FIG. 4A to FIG. 4D. First, as shown in FIG. 4A, a nonmagnetic metal layer 21 such as a Cu layer, which is a formation source of the conduction parts 15, is formed on the magnetization fixed layer 5, and a metal layer 22 such as an Al layer, which is a formation base of the insulation layer 14, is formed thereon.

Figure 4B:
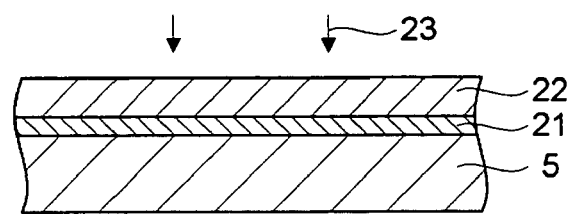

Next, as shown in FIG. 4B, the metal layer 22 as the formation base of the insulation layer 14 is irradiated with ion beams 23, so that nuclei of the conduction parts 15 are produced. The irradiation of the metal layer 22 with the ion beams 23 causes the cohesion of atoms or the like, so that part of the magnetic metal layer 21 positioned on a lower side of the metal layer 22 are absorbed up, so that portions to be the nuclei of the conduction parts 15 are produced. Instead of the ion beams 23, plasma may be adopted for the process of producing the nuclei of the conduction parts 15. Further, it is also possible to produce the nuclei of the conduction parts 15 with heat assist at 100 to 200° C. These kinds of processing may be applied in combination.

Figure 4C:
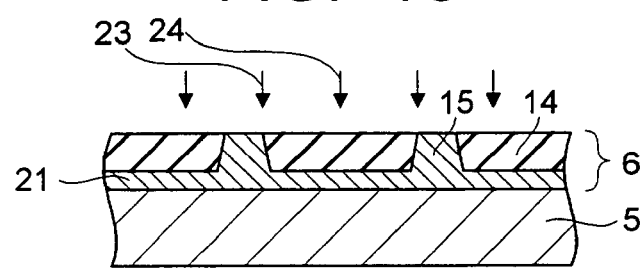

Subsequently, as shown in FIG. 4C, oxygen 24 is introduced along with the irradiation of the ion beams 23 to oxidize the metal layer 22 such as the Al layer, thereby forming the insulation layer 14. By such irradiation of the ion beams 23 in addition to the oxygen 24, the metal layer 22 such as the Al layer is selectively oxidized. Meanwhile, since the nonmagnetic metal layer 21 such as the Cu layer is absorbed upward and at the same time, is reduced, so that the conduction parts 15 made of the nonmagnetic metal such as Cu are formed in the insulation layer 14. At this time, crystals of the conduction parts 15 not only grow based on the nuclei produced in the second process but also grow while maintaining good crystallinity owing to the reduction by the ion beams 23. Further, the crystal growth direction thereof becomes substantially perpendicular to the film plane.

Plasma irradiation may be adopted instead of the irradiation of the ion beams 23 in the formation process of the conduction parts 15, as in the nuclei producing process. That is, the simultaneous irradiation of plasma and oxygen also makes it possible to obtain the conduction parts 15 excellent in crystallinity. Further, the exposure to oxygen with heat assist at 100 to 200° C. also makes it possible to obtain the conduction parts 15 excellent in crystallinity. Note that the nuclei producing process can be omitted depending on conditions if the heat assist is adopted. Further, the combination of these kinds of processing of the ion beam irradiation, plasma irradiation, and heat assist may be adopted for executing the formation process of the conduction parts 15.

Figure 4D:
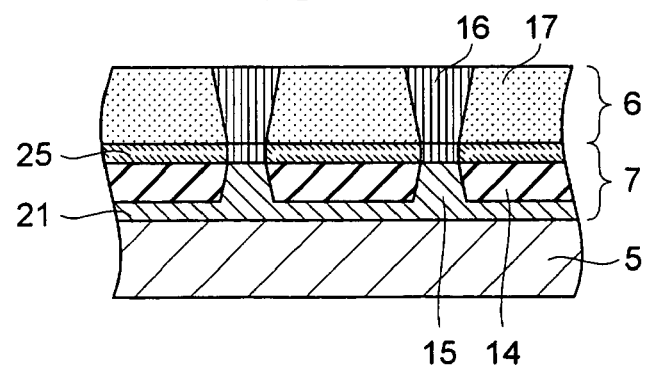

Thereafter, as shown in FIG. 4D, a nonmagnetic metal layer 25 such as a Cu layer, which is to be the extended portions of the conduction parts 15, and the magnetization free layer (ferromagnetic film) 7 are deposited in sequence on the nonmagnetic intermediate layer 6 having the conduction parts 15. Note that the formation of the magnetic metal layer 25 may be omitted. Crystal growth of portions positioned above the conduction parts 15 in the magnetization free layer 7 is continuous from the conduction parts 15 excellent in crystallinity, and therefore these portions become the perpendicular orientation parts 16 whose crystal growth direction is perpendicular to the film plane. Portions other than the perpendicular orientation parts 16 become the non-perpendicular orientation parts 17 having the amorphous state or the low-crystalline state due to the amorphous insulation parts 14 as previously described. In this manner, the magnetization free layer 7 having the perpendicular orientation parts 16 and the non-perpendicular orientation parts 17 can be obtained.

The sense current is passed in the direction perpendicular to the film plane through the spin-valve magnetoresistive effect film 2 having a multilayer film structure of the magnetization fixed layer 5/the nonmagnetic intermediate layer 6/the magnetization free layer 7, from the lower electrode 3 to the upper electrode 4 which are provided on an upper side and a lower side thereof. The magnetoresistive effect element 1 exhibits a magnetoresistive effect based on the relative magnetization directions of the magnetization free layer 7 and the magnetization fixed layer 5 when the magnetization direction of the magnetization free layer 7 is changed by an external magnetic field such as a signal magnetic field.

Figure 5:
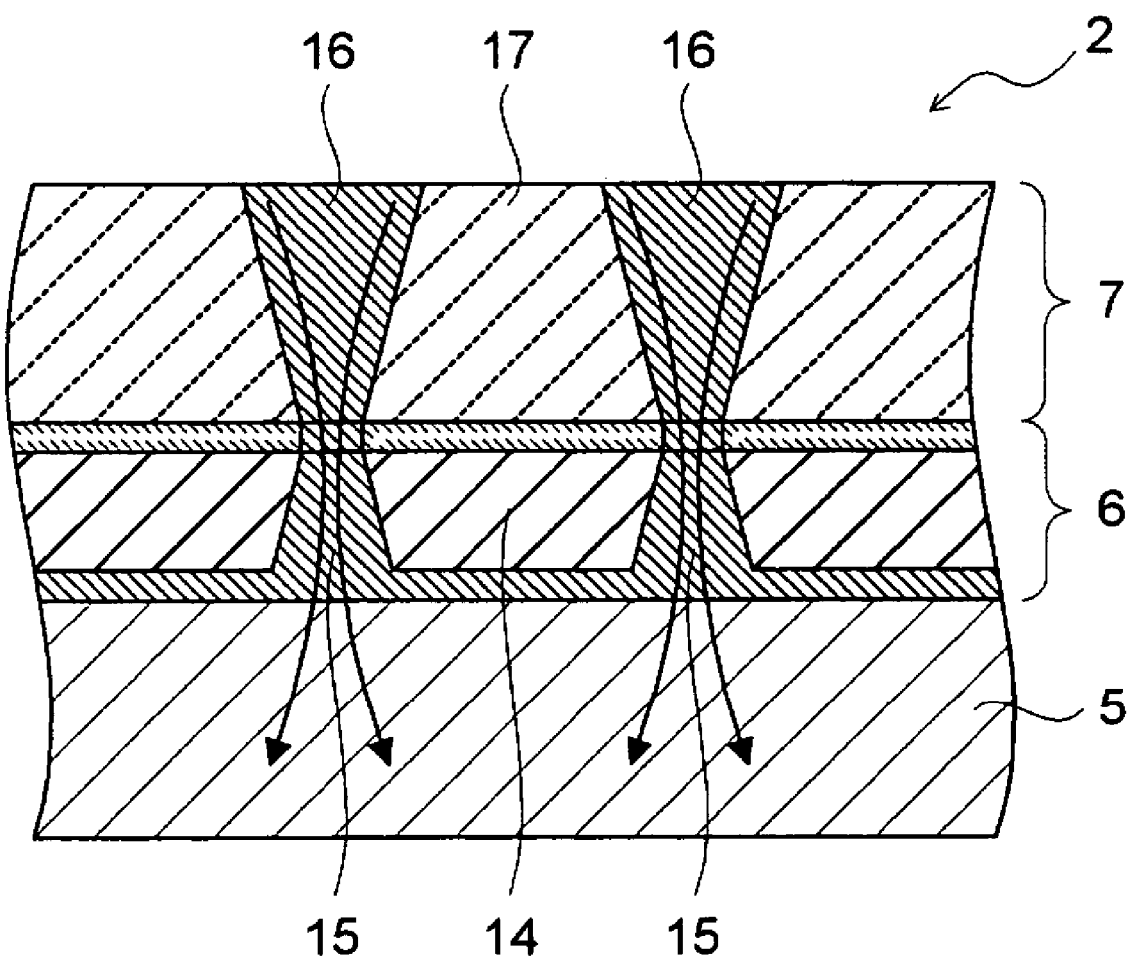
FIG. 5 is a view to illustrate the flow of a sense current in the magnetoresistive effect element shown in FIG. 1.

According to the magnetoresistive effect element 1 as described above, the sense current flows selectively through the perpendicular orientation parts 16 of the magnetization free layer 7, as shown in FIG. 5, in the spin-valve magnetoresistive effect film 2 including the magnetization free layer 7 having the perpendicular orientation parts 16 and the non-perpendicular orientation parts 17. Therefore, the current constriction effect by the conduction parts 15 can be improved. This is because a specific resistance of the non-perpendicular orientation parts 17 in the amorphous state, the low-crystalline state, or the like is higher than that of the perpendicular orientation parts 16 excellent in crystallinity.

Figure 6:
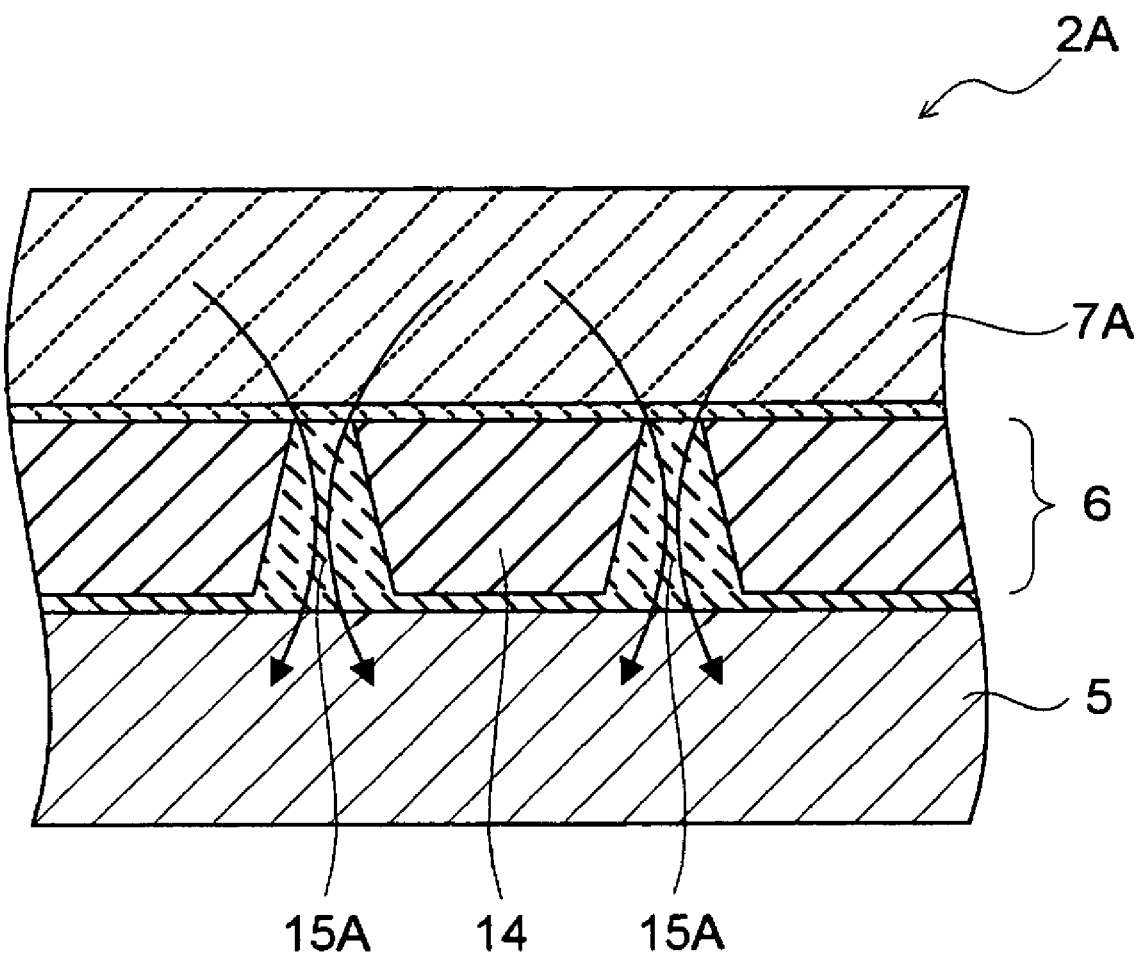
FIG. 6 is a view to illustrate the flow of a sense current in a magnetoresistive effect element according to a comparative example.

Meanwhile, according to a conventional method of forming a conduction part, a metal layer such as an Al layer is simply exposed to oxygen. Therefore, it is not possible to enhance crystallinity of the conduction part though the conduction part is formed simultaneously with the formation of an insulation layer by the oxidation of the metal layer. That is, the conduction part formed by the conventional method is in an amorphous state or a low-crystalline state. Therefore, a magnetization free layer formed on such a conduction part is in an amorphous state or a low-crystalline state, similarly to the conduction part. FIG. 6 shows the flow of a sense current in a spin-valve magnetoresistive effect film formed by such a conventional method.

In a conventional spin-valve magnetoresistive effect film 2A shown in FIG. 6, conduction parts 15A are in an amorphous state or a low-crystalline state, and similarly, a magnetization free layer 7A entirely is in an amorphous state or a low-crystalline state. In such a spin-valve magnetoresistive effect film 2A, though current constriction toward the conduction part 15A occurs, high-level current constriction as in the above-described embodiment does not occur since the magnetization free layer 7A is uniformly in the amorphous state or the low-crystalline state. Further, since the conduction parts 15A and the magnetization free layer 7A are in the amorphous state or the low-crystalline state, spin-independent scattering of electrons increases. This implies deterioration of the magnetoresistive effect (MR).

The magnetoresistive effect (MR) of the spin-valve magnetoresistive effect film 2 can be expressed as MR=$\Delta$Rsd/(Rsd+Rsi). Rsd is a resistance value of a spin-dependent scattering portion (the magnetization fixed layer 5/the nonmagnetic intermediate layer 6/the magnetization free layer 7) contributing to MR, $\Delta$Rsd is a resistance change amount of this portion, and Rsi is a resistance value of a portion not contributing to MR (the base layer 8, the antiferromagnetic layer 9, the protective layer 13, and so on). As is apparent from the above expression, the magnetoresistive effect (MR) can be enhanced by increasing the resistance change amount $\Delta$Rsd in the spin-dependent scattering portion. In the spin-dependent scattering portion, the narrower an area where the current flows, the more the resistance change amount $\Delta$Rsd is increased.

In the spin-valve magnetoresistive effect film 2 of this embodiment, since the current constriction effect is enhanced by a difference in specific resistance between the perpendicular orientation parts 16 and the non-perpendicular orientation parts 17 of the magnetization free layer 7, the resistance change amount $\Delta$Rsd can be increased. Accordingly, the magnetoresistance effect (MR) can be improved. Further, owing to the excellent crystallinity of the conduction parts 15 and the perpendicular orientation parts 16, spin-independent scattering of electrons can be suppressed in these portions. This means that the deterioration of MR by the spin-independent scattering of electrons is suppressed. Therefore, according to the spin-valve magnetoresistive effect film 2 including the magnetization free layer 7 having the perpendicular orientation parts 16 and the non-perpendicular orientation parts 17, a high magnetoresistive effect based on the conduction parts 15 can be obtained with good reproducibility.

Note that the positions of the magnetization fixed layer 5 and the magnetization free layer 7 may be reversed as previously described, though the description here has been mainly on the structure where the magnetization free layer 7 is disposed on the upper side of the nonmagnetic intermediate layer 6. That is, the structure where the magnetization fixed layer 5 is disposed on the upper side of the nonmagnetic intermediate layer 6 can also provide the same effect. In this case, adopted is a structure in which the magnetization fixed layer 5 formed on the upper side of the nonmagnetic intermediate layer 6 has the perpendicular orientation parts 16 and the non-perpendicular orientation parts 17.

The magnetoresistive effect element 1 of this embodiment is used as a constituent element of a magnetic head and the like similarly to a conventional magnetoresistive effect element. The magnetoresistive effect element 1 is usable as a constituent element not only of the magnetic head but also of a magnetic recording apparatus such as a magnetic memory. The magnetic head including the magnetoresistive effect element 1 of this embodiment is used as a reproducing head for reading information magnetically recorded on a magnetic recording medium. The reproducing head to which the magnetic head of the present invention is applied can be integrated with a recording head for use.

Figure 7:
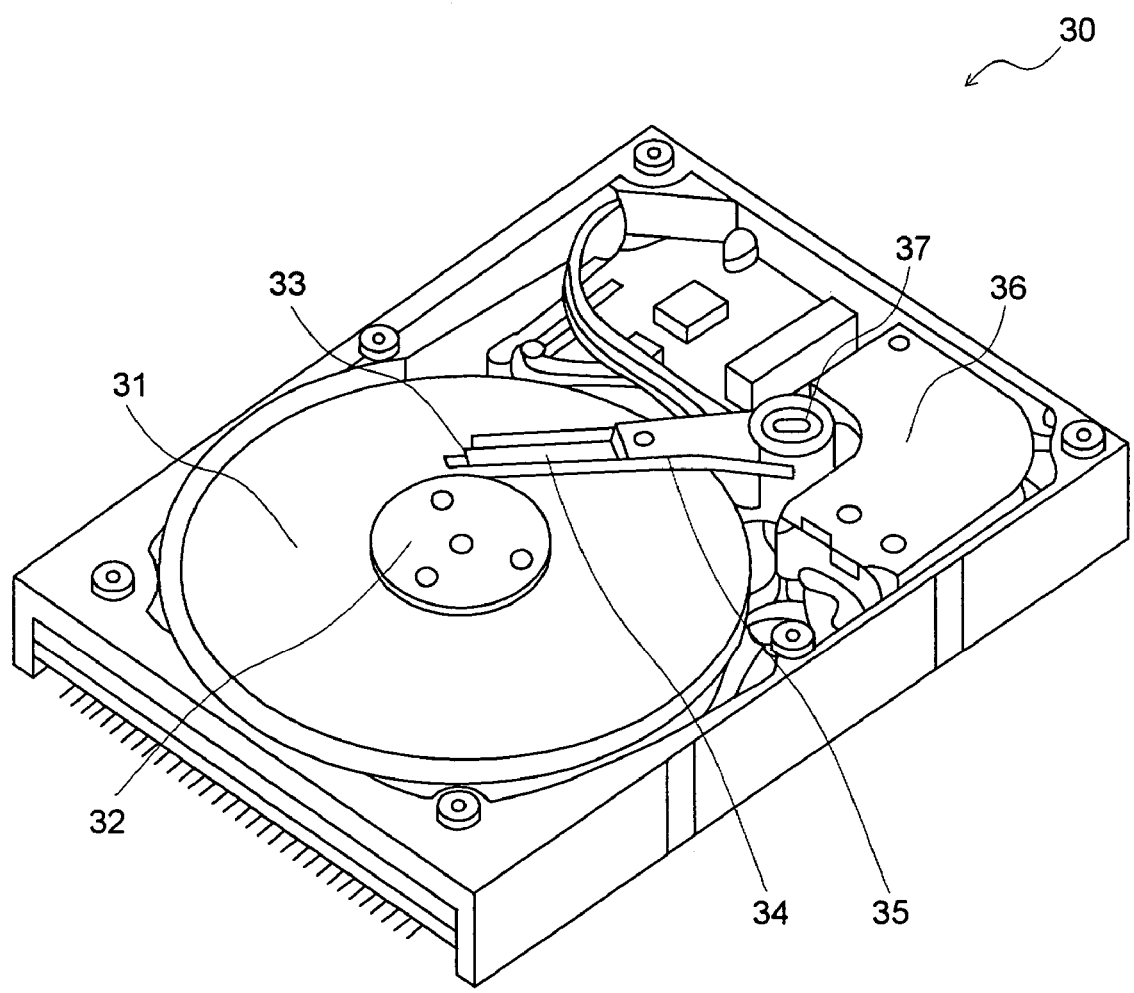
FIG. 7 is a perspective view showing a structure of a magnetic reproducing apparatus according to an embodiment of the present invention.

FIG. 7 is a perspective view showing a configuration of one embodiment in which a magnetic reproducing apparatus of the present invention is applied to a magnetic disk apparatus. A magnetic disk 31 is mounted to a spindle 32 to rotate by a motor (not shown) responding to a control signal. A head slider 33 recording/reproducing information while floating above the magnetic disk 31 is attached at a tip of a suspension 34 in a thin film form. When the magnetic disk 31 rotates, a medium-facing surface (ABS) of the head slider 33 is held with a predetermined floating amount from a surface of the magnetic disk 31. The head slider 33 includes a magnetic head having a reproducing head to which the magnetoresistive effect element 1 of the embodiment described above is applied, and a recording head formed integrally with the reproducing head.

The suspension 34 is connected to one end of an actuator arm 35. A voice coil motor 36, which is a kind of a linear motor, is provided at the other end of the actuator arm 35. The voice coil motor 36 is composed of: a driving coil coiled around a bobbin part of the actuator arm 35; and a magnetic circuit composed of a permanent magnet and a counter yoke which face each other across the driving coil. The actuator arm 35 is held by not-shown ball bearings provided at two places in an upper and a lower portion of a fixed shaft 37 and is rotatable/slidable by the voice coil motor 36.

Next, concrete examples of the present invention and evaluation results thereof will be described.

EXAMPLE 1, COMPARATIVE EXAMPLES 1, 2

In Example 1, the magnetoresistive effect element 1 whose structure is shown in FIG. 2 was prepared. That is, in the magnetoresistive effect element 1 whose structure is shown in FIG. 2, a multilayer film of a Ta film with a thickness of 5 nm and a Ru film with a thickness of 2 nm was used as the base layer 8 of the spin-valve magnetoresistive effect film 2. A PtMn alloy film with a thickness of 15 nm was formed as the antiferromagnetic film 9 on the base layer 8. Further, as the magnetization fixed layer 5, a $Co_{90}Fe_{10}$ alloy film 11 with a thickness of 4 nm, a Ru film 10 with a thickness of 0.9 nm, and a $Co_{90}Fe_{10}$ alloy film 12 with a thickness of 4 nm were formed on the antiferromagnetic layer 9 in this order.

Next, the nonmagnetic intermediate layer 6 having the insulation parts 14 and the conduction parts 15 was formed on the magnetization fixed layer 5. Specifically, a Cu layer with a thickness of 0.5 nm was formed on the magnetization fixed layer 5, and an Al layer with a thickness of 1.5 nm was further formed thereon. Next, the Al layer was irradiated with $Ar^+$ ion beams to produce nuclei. Thereafter, oxygen was introduced therein along with the irradiation of the $Ar^+$ ion beams. Consequently, the Al layer was oxidized to form the insulation layer 14, and at the same time, the conduction parts 15 made of Cu were formed in the insulation layer 14. Note that the number of the conduction parts 15 can be adjusted by controlling conditions (ion beam irradiation intensity, ion beam irradiation time, and so on) of the nuclei producing process.

Figure 8:
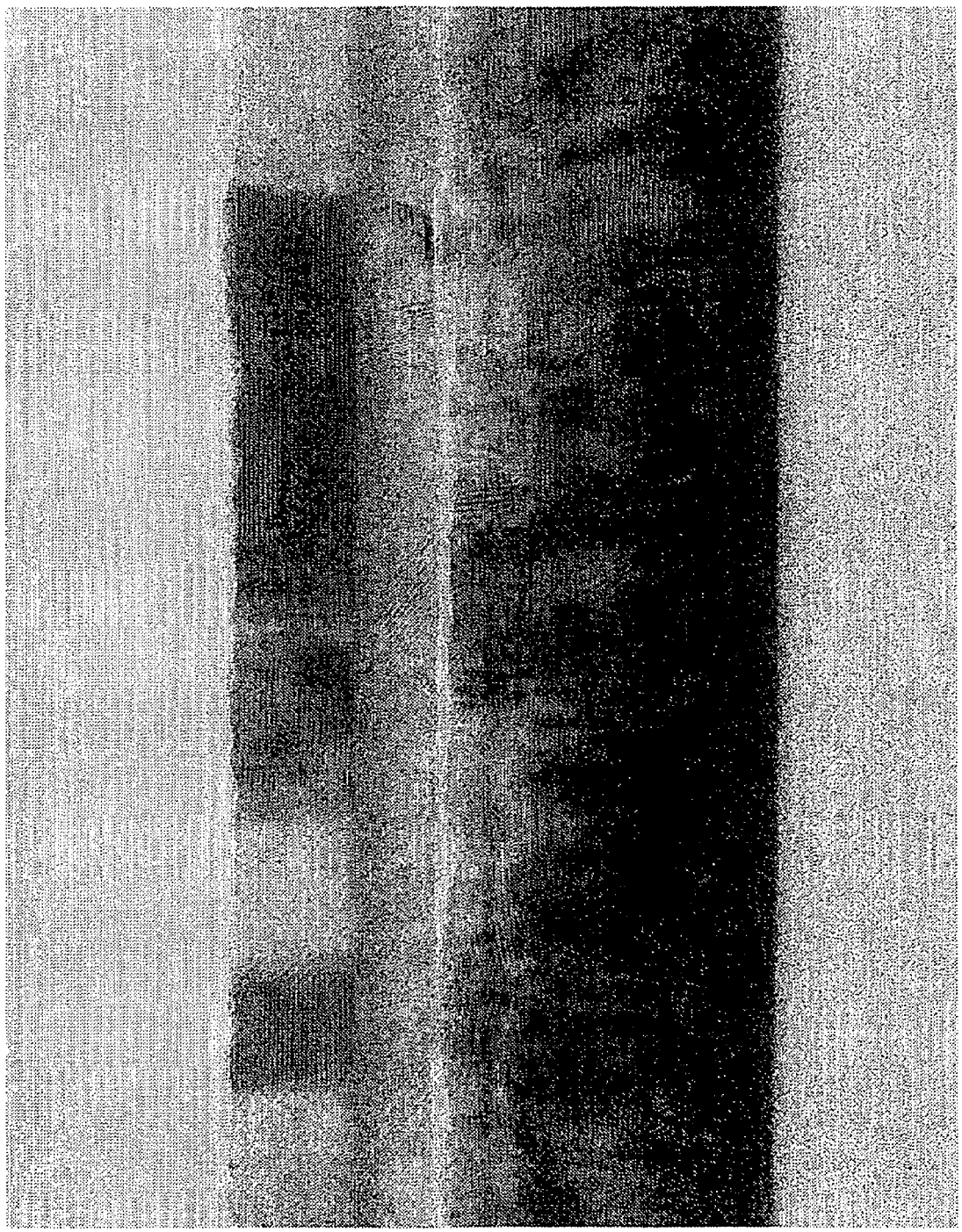
FIG. 8 is a cross-section TEM photograph of a spin-valve magnetoresistive effect film according to Example 1.

Thereafter, as the magnetization free layer 7, a $Co_{90}Fe_{10}$ alloy film with a thickness of 1 nm and a $Ni_{80}Fe_{20}$ alloy film with a thickness of 3 nm were formed on the nonmagnetic intermediate layer 6 in this order. Further, as the protective layer 13, a multilayer film of a Cu film with a thickness of 1 nm and a Ta film with a thickness of 5 nm was formed on the magnetization free layer 7. FIG. 8 shows a cross-section TEM photograph of thus obtained multilayer film (the spin-valve magnetoresistive effect film 2). In the spin-valve magnetoresistive effect film of Example 1, the conduction parts 15 were excellent in crystallinity, and the perpendicular orientation parts 16 of the magnetization free layer 7 were formed above the conduction parts 15. Further, portions positioned above the insulation parts 14 in the magnetization free layer 7 were in an amorphous state or a low-crystalline state. These facts were confirmed by Fourier-transforming the cross-section TEM photograph (FIG. 8).

Figure 9:
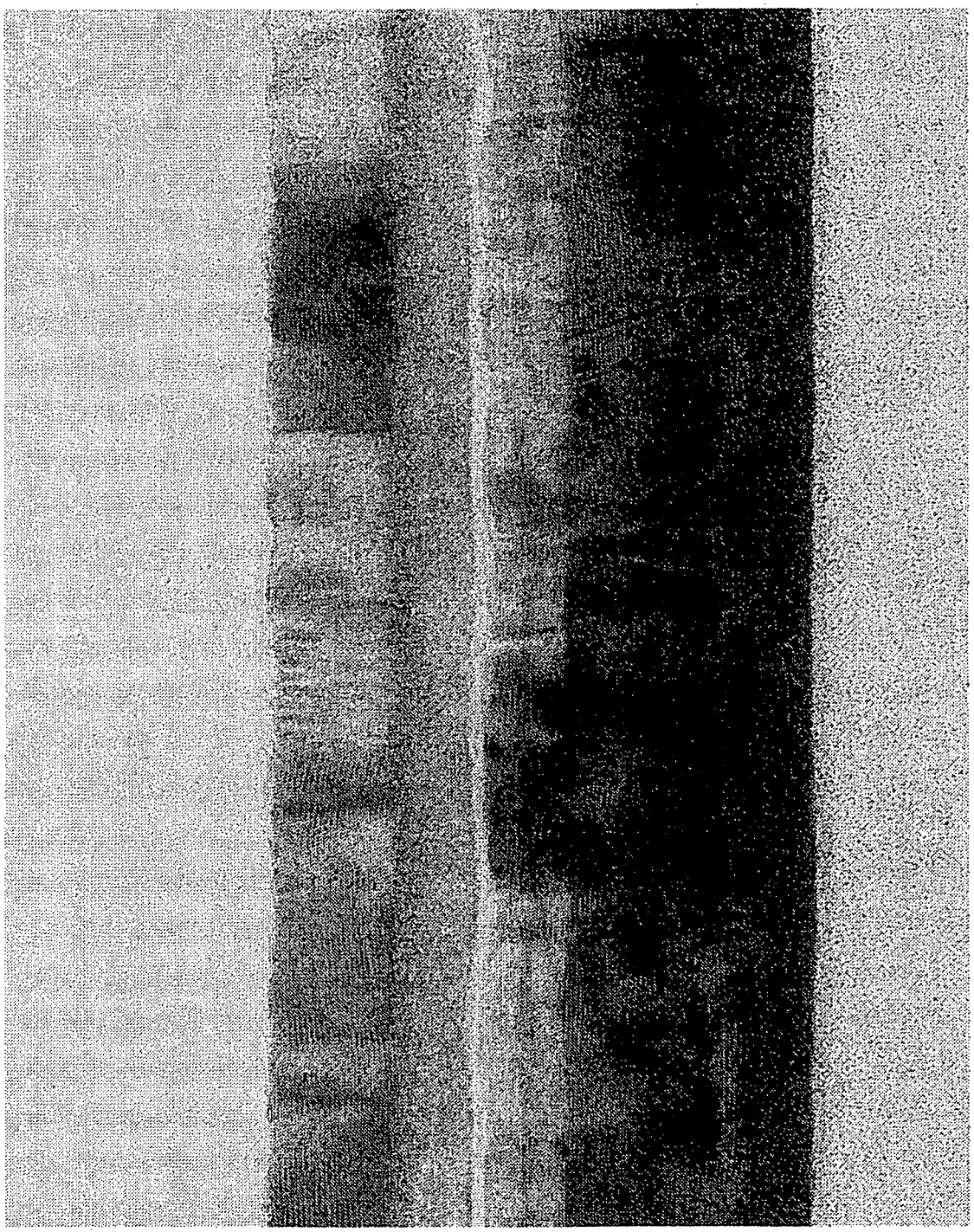
FIG. 9 is a cross-section TEM photograph of a spin-valve magnetoresistive effect film according to Comparative Example 1.

Meanwhile, a spin-valve magnetoresistive effect film was prepared as Comparative Example 1 to the present invention in the same manner as that of Example 1 except that, for forming a nonmagnetic intermediate layer, an Al layer as a formation base of an insulation layer was simply irradiated with oxygen without any irradiation of ion beams. FIG. 9 shows a cross-section TEM photograph of this spin-valve magnetoresistive effect film. In the spin-valve magnetoresistive effect film of Comparative Example 1, conduction parts, though formed in the insulation layer, were in an amorphous state or a low-crystalline state. Further, a magnetization free layer was also entirely in an amorphous state or a low-crystalline state. These facts were confirmed by Fourier-transforming the cross-section TEM photograph (FIG. 9).

Figure 10:
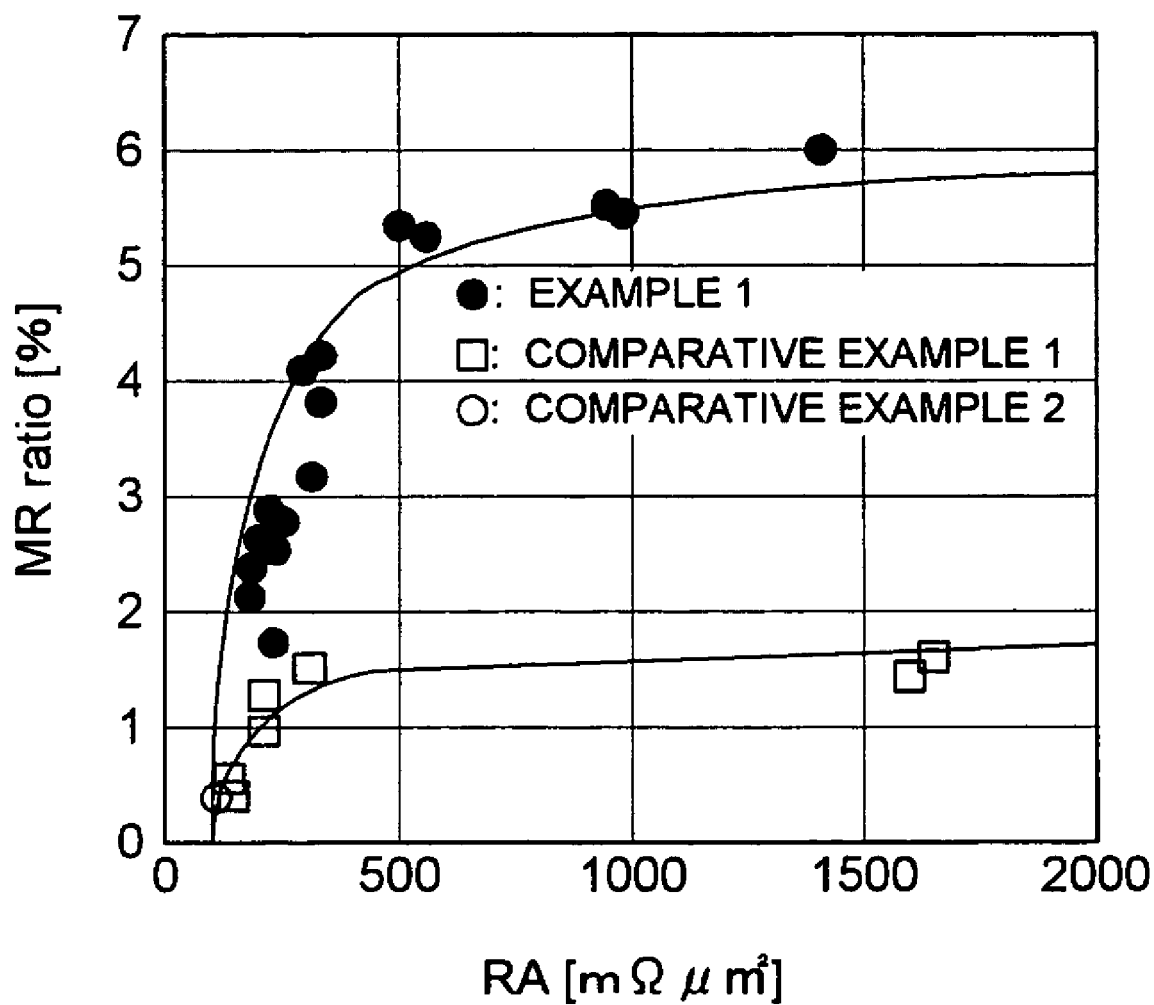
FIG. 10 is a chart showing the relation between an element resistance and a MR ratio of the spin-valve magnetoresistive effect element according to Example 1 and Comparative Example 2.

Next, each of the spin valve magnetoresistive effect films of Example 1 and Comparative Example 1 described above was patterned by lithography to a 1 μm×1 μm size, and electrodes were further disposed on an upper and a lower side thereof, thereby preparing magnetoresistive effect elements. MR ratios of the respective magnetoresistive effect elements thus obtained were measured. Here, an element resistance RA of each of the magnetoresistive effect elements was varied based on the number of the conduction parts, and the MR ratios of the respective magnetic resistance effect elements were measured. FIG. 10 shows the measurement results. FIG. 10 shows the relation between the element resistance RA and the MR ratio of each of the magnetoresistive effect elements. Note that Comparative Example 2 in FIG. 10 is a magnetoresistive effect element to which a Cu layer with a single-layer structure is used as the intermediate layer.

As is apparent from FIG. 10, the spin-valvemagnetoresistive effect element according to Example 1 has an improved MR ratio compared with Comparative Example 1. The improved crystallinity of the conduction parts 15 and the perpendicular orientation parts 16 of the magnetization free layer 7 contribute to this improvement. Incidentally, the same result was also obtained when plasma irradiation or heat assist was adopted in the formation process of the nonmagnetic intermediate layer 6. Further, the same result was obtained when the positions of the magnetization free layer 7 and the magnetization fixed layer 5 were reversed.

EXAMPLES 2 TO 5, COMPARATIVE EXAMPLES 3 TO 6

Spin-valve magnetoresistive effect elements were prepared in the same manner as that of Example 1 except that materials forming the magnetization fixed layer 5 and the magnetization free layer 7 in the above-described Example 1 were changed to materials shown in Table 1. As in Example 1, it was confirmed that the spin-valve magnetoresistive effect elements of Examples 2 to 5 all had conduction parts 15 excellent in crystallinity, and perpendicular orientation parts 16 of a magnetization free layer 7 were formed above the conduction parts 15. Further, spin-valve magnetoresistive effect elements of Comparative Examples 3 to 6 were prepared in the same manner as that of the Examples 2 to 5 except that the same formation process of the nonmagnetic intermediate layer as that in the Comparative Example 1 was used. MR ratios of the respective spin-valve magnetoresistive effect elements were measured. Table 1 also shows the measurement result of the MR ratios.

TABLE 1

|  | Magnetization fixed layer | Magnetization free layer | MR ratio (%) |
|---|---|---|---|
| Example 2 | $Fe_{50}Co_{50}$ (3 nm) | $Co_{90}Fe_{10}$ (1 nm)/ $Ni_{80}Fe_{20}$ (3 nm) | 7.0 |
| Comparative Example 3 |  |  | 1.2 |
| Example 3 | ($Fe_{50}Co_{50}$ (1 nm)/ Cu (0.25 nm)) × 2/ $Fe_{50}Co_{50}$ (1 nm) | $Co_{90}Fe_{10}$ (1 nm)/ $Ni_{80}Fe_{20}$ (3 nm) | 8.0 |
| Comparative Example 4 |  |  | 1.4 |
| Example 4 | $Fe_{80}Co_{20}$ (3 nm) | $Co_{90}Fe_{10}$ (1 nm)/ $Ni_{80}Fe_{20}$ (3 nm) | 7.0 |
| Comparative Example 5 |  |  | 1.2 |
| Example 5 | ($Fe_{80}Co_{20}$ (1 nm)/ Cu (0.25 nm)) × 2/ $Fe_{80}Co_{20}$ (1 nm) | $Co_{90}Fe_{10}$ (1 nm)/ $Ni_{80}Fe_{20}$ (3 nm) | 8.0 |
| Comparative Example 6 |  |  | 1.3 |

As is apparent from Table 1, large MR ratios were obtained in the magnetoresistive effect elements in all the examples. Thus, it is possible to improve crystallinity of the conduction parts and form the perpendicular orientation part thereabove, so that the magnetoresistive effect can be improved also when various ferromagnetic films were used as the magnetization fixed layer and the magnetization free layer.

It should be noted that the present invention is not limited to the embodiments described above, but various modifications can be made without departing from the spirit of the present invention when the present invention is embodied. Further, the present invention can be embodied by appropriately combining the embodiments to an allowable extent, which can provide combined effects. Further, the above-described embodiments include inventions on various stages, and by appropriately combining these inventions under a plurality of features that are disclosed, various inventions can be extracted therefrom.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive effect element, comprising:
   a magnetization fixed layer having a ferromagnetic film whose magnetization direction is fixed substantially in one direction;
   a magnetization free layer having a ferromagnetic film whose magnetization direction changes according to an external magnetic field;
   a nonmagnetic intermediate layer having an insulation layer and a conduction part, the insulation layer being interposed between the magnetization fixed layer and the magnetization free layer, and the conduction part being disposed in the insulation layer so as to connect the magnetization fixed layer and the magnetization free layer and made of a nonmagnetic metal material; and
   a pair of electrodes arranged so as to pass a sense current in a direction substantially perpendicular to film planes of the magnetization fixed layer, the nonmagnetic intermediate layer, and the magnetization free layer,
   wherein the ferromagnetic film stacked on an upper side of the nonmagnetic intermediate layer, out of the ferromagnetic films constituting the magnetization fixed layer and the magnetization free layer, has a crystalline perpendicular orientation part and a non-perpendicular orientation part, the crystalline perpendicular orientation part being disposed above the conduction part, with crystal growth direction thereof substantially perpendicular to the film plane of the nonmagnetic intermediate layer, and the non-perpendicular orientation part existing in a portion other than the crystalline perpendicular orientation part.

2. The magnetoresistive effect element as set forth in claim 1,
   wherein the nonmagnetic metal material constituting the conduction part is mainly made of at least one selected from Cu (copper), gold (Au), silver (Ag), platinum (Pt) chromium (Cr), tantalum (Ta), titanium (Ti), and manganese (Mn).

3. The magnetoresistive effect element as set forth in claim 1,
   wherein the conduction part has a dimension in a range from 2 to 5 nm.

4. The magnetoresistive effect element as set forth in claim 1,
   wherein the conduction part realizes point contact between the magnetization fixed layer and the magnetization free layer to increase a resistance value of a portion where the magnetization fixed layer, the nonmagnetic intermediate layer, and the magnetization free layer are stacked.

5. The magnetoresistive effect element as set forth in claim 1,
   wherein the insulation layer has a thickness of 5 nm or less.

6. The magnetoresistive effect element as set forth in claim 1,
   wherein the conduction part has a crystalline state with crystal orientation.

7. The magnetoresistive effect element as set forth in claim 1,
   wherein the conduction part has a crystalline state with a crystal growth direction being substantially perpendicular to the film plane.

8. The magnetoresistive effect element a set forth in claim 1,
   wherein the non-perpendicular orientation part has an amorphous state, low-crystalline state, or a crystalline state with a crystalline orientation direction being different from a crystalline orientation direction of the crystalline perpendicular orientation part.

9. The magnetoresistive effect element as set forth in claim 1,
   wherein the non-perpendicular orientation part is disposed above the insulation layer with an amorphous state and has an amorphous state or a low-crystalline state.

10. The magnetoresistive effect element set forth in claim 1,
    wherein the magnetization free layer is disposed on an upper side of the magnetization fixed layer via the nonmagnetic intermediate layer, and the ferromagnetic film constituting the magnetization free layer has the crystalline perpendicular orientation part and the non-perpendicular orientation part.

11. The magnetoresistive effect element as set forth in claim 1,
wherein the magnetization fixed layer is stacked with an antiferromagnetic layer.

12. A magnetic head comprising the magnetoresistive effect element as set forth in claim 1.

13. A magnetic reproducing apparatus, comprising:
a magnetic recording medium; and
a magnetic head which reads information magnetically recorded on the magnetic recording medium and includes the magnetoresistive effect element as set forth in claim 1.

14. A magnetoresistive effect element, comprising:
a fixed ferromagnetic layer having a magnetization direction that is substantially fixed;
a free ferromagnetic layer having a magnetization direction that changes according to an external magnetic field;
a nonmagnetic intermediate layer interposed between the fixed ferromagnetic layer and the free ferromagnetic layer, wherein the nonmagnetic intermediate layer includes an insulation layer and one or more nonmagnetic, metal conduction portions provided so as to connect the fixed ferromagnetic layer and the free ferromagnetic layer; and
a pair of electrodes,
wherein the free ferromagnetic layer includes one or more crystalline perpendicular orientation portions provided in correspondence with the one or more conduction portions.

15. The magnetoresistive element as set forth in claim 14, wherein the free ferromagnetic member includes a non-perpendicular orientation portion.

16. A system comprising a magnetic head that includes the magnetoresistive effect element as set forth in claim 14.

17. A magnetoresistive effect element, comprising:
a fixed ferromagnetic layer having a magnetization direction that is substantially fixed;
a free ferromagnetic layer having a magnetization direction that changes according to an external magnetic field;
a nonmagnetic intermediate layer interposed between the fixed ferromagnetic layer and the free ferromagnetic layer, wherein the nonmagnetic intermediate layer includes an insulation layer and one or more nonmagnetic, metal conduction portion provided so as to connect the magnetization fixed layer and the magnetization free layer; and
a pair of electrodes,
wherein the fixed ferromagnetic layer includes one or more crystalline perpendicular orientation portions provided in correspondence with the one or more conduction portions.

18. The magnetoresistive element as set forth in claim 17, wherein the fixed ferromagnetic member includes a non-perpendicular orientation portion.

19. A system comprising a magnetic head that includes the magnetoresistive effect element as set forth in claim 17.

* * * * *